United States Patent
Nicolas et al.

(10) Patent No.: US 7,999,713 B2
(45) Date of Patent: Aug. 16, 2011

(54) PARALLEL ANALOG-DIGITAL CONVERTER WITH DUAL STATIC LADDER

(75) Inventors: Jean-Alain Nicolas, Grenoble (FR); Richard Morisson, Grenoble (FR)

(73) Assignee: E2V Semiconductors (FR)

( * ) Notice: Subject to any disclaimer, the term of this patent is extended or adjusted under 35 U.S.C. 154(b) by 0 days.

(21) Appl. No.: 12/530,521

(22) PCT Filed: Mar. 13, 2008

(86) PCT No.: PCT/EP2008/052989
§ 371 (c)(1),
(2), (4) Date: Sep. 18, 2009

(87) PCT Pub. No.: WO2008/113738
PCT Pub. Date: Sep. 25, 2008

(65) Prior Publication Data
US 2010/0085232 A1    Apr. 8, 2010

(30) Foreign Application Priority Data
Mar. 16, 2007    (FR) ..................... 07 01932

(51) Int. Cl.
*H03M 1/12*    (2006.01)
(52) U.S. Cl. ........ 341/155; 341/118; 341/120; 341/154; 341/159
(58) Field of Classification Search .......... 341/118–121, 341/155, 158, 159, 154
See application file for complete search history.

(56) References Cited

U.S. PATENT DOCUMENTS

| | | | | |
|---|---|---|---|---|
| 5,157,397 A * | 10/1992 | Vernon | ......................... | 341/159 |
| 5,539,406 A * | 7/1996 | Kouno et al. | ................. | 341/155 |
| 6,437,724 B1 * | 8/2002 | Nagaraj | ......................... | 341/159 |
| 6,504,499 B1 * | 1/2003 | Masenas et al. | .............. | 341/155 |
| 6,518,898 B1 * | 2/2003 | Choksi | .......................... | 341/118 |
| 6,954,165 B2 * | 10/2005 | Mallinson | ...................... | 341/144 |
| 6,963,298 B2 * | 11/2005 | Otsuka et al. | ................. | 341/155 |
| 6,989,778 B2 * | 1/2006 | Clara et al. | ..................... | 341/143 |
| 7,102,424 B2 * | 9/2006 | Vorenkamp | .................... | 327/540 |
| 7,212,144 B1 | 5/2007 | Sutardja | | |
| 7,382,306 B2 * | 6/2008 | Takahashi | ..................... | 341/158 |
| 7,532,142 B1 * | 5/2009 | Voegeli et al. | ................ | 341/154 |
| 2003/0043065 A1 | 3/2003 | Lin et al. | | |
| 2003/0043066 A1 | 3/2003 | Otsuka et al. | | |
| 2005/0128118 A1 * | 6/2005 | Devendorf et al. | ........... | 341/158 |
| 2007/0109167 A1 * | 5/2007 | Morisson | ...................... | 341/155 |

FOREIGN PATENT DOCUMENTS

| | | |
|---|---|---|
| FR | 2843254 A1 | 2/2004 |
| WO | 9112667 A | 8/1991 |

* cited by examiner

*Primary Examiner* — Linh V Nguyen
(74) *Attorney, Agent, or Firm* — Lowe Hauptman Ham & Berner, LLP

(57) ABSTRACT

The invention relates to fast, high resolution, analog digital converters, and more particularly those which possess at least one conversion stage of "flash" type. The converter according to the invention uses N differential amplifiers with four inputs. The amplifier of rank j receives the input voltage to be converted $V_{ep} - V_{en}$ on two first inputs, and a reference potential difference on two other inputs. The reference potential difference is obtained between two taps of networks of resistors that are identical operating in parallel and supplied between a high voltage source and a low current source; the taps for an amplifier are respectively a tap $P_j$ of rank j of a first network and a tap $P'_{N-j+1}$ of rank $N-j+1$ of a second network. This reduces the first and second order non-linearity effects due to the fact that the differential amplifiers consume an input current tapped off from the networks of resistors.

14 Claims, 3 Drawing Sheets

PARALLEL ANALOG-DIGITAL CONVERTER WITH DUAL STATIC LADDER

CROSS-REFERENCE TO RELATED APPLICATIONS

The present Application is based on International Application No. PCT/EP2008/052989, filed on Mar. 13, 2008, which in turn corresponds to French Application No. Mar. 16, 2007, and priority is hereby claimed under 35 USC §119 based on these applications. Each of these applications are hereby incorporated by reference in their entirety into the present application.

FIELD OF THE INVENTION

The invention relates to fast analog digital converters, and more particularly those which possess at least one conversion stage of "flash" type, that is to say a parallel-structure stage in which the voltage to be converted is simultaneously compared with a series of reference voltages $V_j$ where j is an index varying from 0 to N, all the potential differences $V_{j+1}-V_j$ being assumed identical and equal to a fixed elementary reference voltage $V_{tap}$.

BACKGROUND OF THE INVENTION

Such converters generally use a network of identical resistors R in series supplied with a constant current $I_0$ so as to produce the reference voltages distributed at regular intervals of value $V_{tap}=R \cdot I_0$, and N differential amplifiers each associated with a respective reference voltage so as to determine whether the input voltage is greater or less than this reference voltage or to linearly amplify the disparity between the input voltage and this reference voltage. The junction points of the resistors constitute intermediate taps connected to the inputs of the amplifiers.

The simplest structure is that which is represented in FIG. 1 depicting a network of resistors in series $R_1$ to $R_N$ traversed by a fixed current $I_0$ and a set of differential amplifiers or comparators $A_1$ to $A_N$, the amplifier $A_j$ of rank j receiving on the one hand the voltage $V_{in}$ to be converted, and on the other hand the voltage at the junction point of resistor $R_{j+1}$ and resistor $R_j$.

This structure can be used for a final analog-digital conversion stage, the amplifiers toggling in one direction or the other depending on the direction of the difference between the input voltage and the reference voltage. It can also be used as input stage or intermediate analog-digital conversion stage, followed by other conversion stages, and in this case each amplifier must provide, destined for the following stages, a voltage or a current varying linearly as a function of the difference between the input voltage $V_{in}$ and the reference voltage associated with this amplifier.

It is desired to be able to make converters having ever greater linearity so as to be able to perform precise conversions with ever higher resolution. It is sought for example to make converters with 12 or 14 bit resolution. The linearity errors are due to the imperfections of the resistors which may have values that are not entirely identical; they are due also to the fact that even if the resistors are identical, the inputs of the amplifiers divert a part of the current which crosses the resistors so that the currents traversing the resistors on the top of the series are higher than the currents traversing the resistors on the bottom of the series. FIG. 1 schematically represents an input current $I_b$ diverted onto each amplifier input connected to the network of resistors. This current $I_b$ is in practice the base current of a bipolar input transistor of the amplifier. It follows from this that the potentials of the intermediate taps of the series network of resistors are not regularly distributed with voltage intervals $R \cdot I_0$ between two successive intermediate taps of the series of resistors. It may be reckoned that the overall non-linearity error is proportional to the square of the number N of amplifiers, to the value of the elementary resistance R, and to the value of the input current $I_b$ consumed by each amplifier.

It is not possible to decrease R beyond certain limits for reasons of manufacturing precision and current consumption. The number N depends on the resolution desired for the stage, for example N=64 for 6 bits. A minimum current $I_b$ is imposed by the dynamic performance of the differential amplifiers which must be able to work at high speed. It would be possible to use MOS technologies with low input current consumption but with these technologies it is difficult to achieve sufficient manufacturing precision to obtain the performance afforded by bipolar technologies.

Solutions involving current compensation have already been devised, wherein currents of value $I_b$ are injected into the intermediate taps of the ladder of resistors so as to neutralize the loss of current $I_b$ to the amplifiers. These solutions are complex and very sensitive to temperature variations or to dispersion in the technological manufacturing parameters; this is because the problem is to compensate a base current which is directly related to the gain in current β of the input transistor of the differential stage, but the value of the current gain is highly dispersed and variable with temperature.

Inspiration could possibly be drawn from the differential structure described in patent application WO 2005/055431, which was devised for increasing the speed performance of converters. This structure, recalled in FIG. 2, uses differential amplifiers $A_1$ to $A_N$ with four inputs each; the amplifier $A_j$ of rank j receives on the one hand on two first inputs the differential voltage to be converted $V_{ep}-V_{en}$, and on the other hand on two other inputs the voltages sampled from two symmetric taps, of rank j and N−j+1 respectively, of the network of resistors in series. Thus, the first amplifier A1 is linked to the first intermediate tap $P_1$ and to the last $P_N$, the second is linked to the second tap $P_2$ and to the penultimate $P_{N-2}$, etc. With this structure, it would be possible to solve the problem engendered by this current $I_b$ diverted from each tap of the network of resistors, on account of the symmetry of the structure which establishes a natural compensation for this current. Indeed, what counts in this structure is not the linearity of distribution of the potentials of the taps $P_1$ to $P_N$, it is the linearity of the succession of potential differences between taps $P_j$ and $P_{N-j+1}$ when j increases from 1 to N. Now, whatever j, the voltage drop between the taps $P_j$ and $P_{N-j+1}$ results from the addition of voltage drops in the resistors at the top of the set, traversed by bigger currents, and of voltage drops in the resistors at the bottom, traversed by smaller currents, so that on average the distribution of the voltage drops remains regular, even if the mean current in the resistors is not $I_0$ as would be desired but rather $I_0+N \cdot I_b$.

Nevertheless, this compensation takes place only on condition that the current $I_b$ is independent of the input voltage $V_{ep}-V_{en}$ to be converted. But this is not the case. It would be possible to contrive matters so that this is the case by inserting a follower stage between each tap of the network and the input of the corresponding differential amplifier; but this would introduce additional problems of matching of circuits, of dispersion as a function of temperature, of additional current consumption, of noise introduced by the follower stage, and of additional base-emitter voltage drop which is harmful if it is desired to work with a power supply at very low voltage such as 3.3 volts.

By way of example, a linearity error calculation simulation in the configuration of FIG. 2, for a 14-bit converter whose first stage comprises 80 differential amplifiers, leads to the conclusion that the integral non-linearity error over the conversion ladder may attain 7.5 LSB (least significant bits) in an example where the supply current to the network of resistors is 30 milliamperes, the differential pairs of the amplifiers have current supplies of 200 microamperes, and the mean base current is 1.7 microamperes. The integral non-linearity error INL is the aggregate sum of the differences between the theoretical values of the reference voltages and their actual values. These 7.5 least significant bits represent too big an error, which it is desired to reduce.

It has been noted that if the network of resistors of FIG. 2 was supplied between two reference voltage sources rather than between a high voltage source and a low current source, the integral non-linearity error was divided in a ratio of almost 2.5, which is considerable. Under the same measurement conditions, this leads to an integral non-linearity error of 3 LSB peak to peak for a 14-bit converter, which is much more satisfactory. Power supply through two reference voltages therefore improves performance.

Attempts have also been made to verify whether it was possible to further improve the integral non-linearity of the structure by using a double ladder of resistors in series supplied between two reference voltages, instead of a simple ladder supplied between two reference voltages; one of the inputs of the amplifier is then tapped on a tap of rank j of one of the ladders while the other input is tapped on a tap of rank N−j+1 of the other ladder. But the result is not conclusive since the same conditions as above lead to an integral non-linearity of 4.7 LSB. The double ladder of resistors is therefore useless from the point of view of the integral non-linearity since it impairs performance.

SUMMARY OF THE INVENTION

To improve the linearity of high-resolution analog digital conversion, notably conversion on more than 12 bits, the invention proposes an analog-digital converter comprising a network of N differential amplifiers of rank j=1 to N, each having four inputs, two inputs receiving a differential input voltage to be converted $V_{ep}-V_{en}$, the third and the fourth inputs receiving reference voltages arising from a set of resistors of identical nominal values R traversed by a current of nominal value $I_0$, the amplifier of rank j providing a voltage proportional to $V_{ep}-V_{en}-K \cdot R \cdot I_0$ (K integer) when the differential input voltage $V_{ep}-V_{en}$ is close to the voltage $K \cdot R \cdot I_0$, characterized in that the set of resistors comprises a first network of N resistors of value R in series connected on one side to a voltage source and on the other to a reference current source, the ends of the resistors defining N first taps of rank j=1 to N, and a second network of N resistors of value R in series connected on one side to the same voltage source as the first and on the other to a reference current source such that the two networks are supplied by identical currents, the resistors of the second network defining N second taps of rank j=1 to N, the amplifier of rank j having its third input linked to a tap of rank j of the first network and to a tap of rank N−j+1 of the second network.

The two networks are strictly identical. They are supplied by a common voltage source. A respective current source of value $I_0$ can be provided in series with each network to impose the current which will traverse them. However it is more advantageous to provide a single common current source of double value $2I_0$ simultaneously supplying the two (identical) networks, each of them then being traversed by half the current, namely a current $I_0$.

If it is desired to use N differential amplifiers for the conversion, provision may be made for the converter to comprise a number of amplifiers greater than N, the additional amplifiers being present solely to avoid edge effects. The networks of resistors then comprise more than N resistors each.

The integral non-linearity of the structure thus obtained turns out to be much better (in a ratio of about 30 to 50, which is considerable) than that obtained with the other structures tried. Although supplying power to a simple network with the aid of two reference voltages turns out to be markedly better than supplying power to a simple network through a voltage source and a current source, it has been found that an unexpected improvement of a much greater order of magnitude could be obtained by using a double network on condition that it is not supplied between two reference voltage sources.

Under the same measurement conditions as above, an integral non-linearity of 0.1 LSB peak-to-peak has been obtained for a 14-bit converter, i.e. 75 times better than a simple network supplied in the same manner, 30 times better than a simple network supplied by voltage references, and 50 times better than a double network supplied by voltage references.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF DRAWINGS

The present invention is illustrated by way of example, and not by limitation, in the figures of the accompanying drawings, wherein elements having the same reference numeral designations represent like elements throughout and wherein.

DESCRIPTION OF PREFERRED EMBODIMENTS

Figure 2:
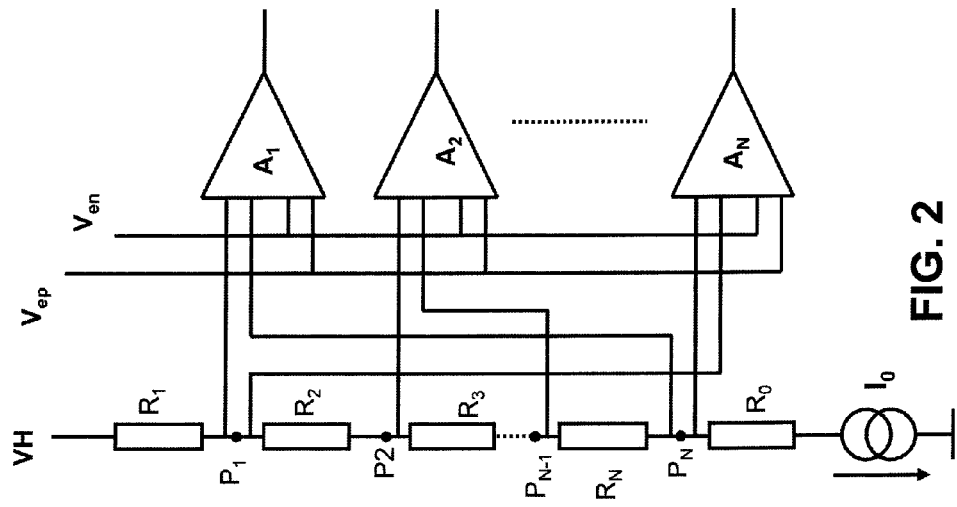
FIG. 2 represents another flash converter principle of the prior art.
Figure 1:
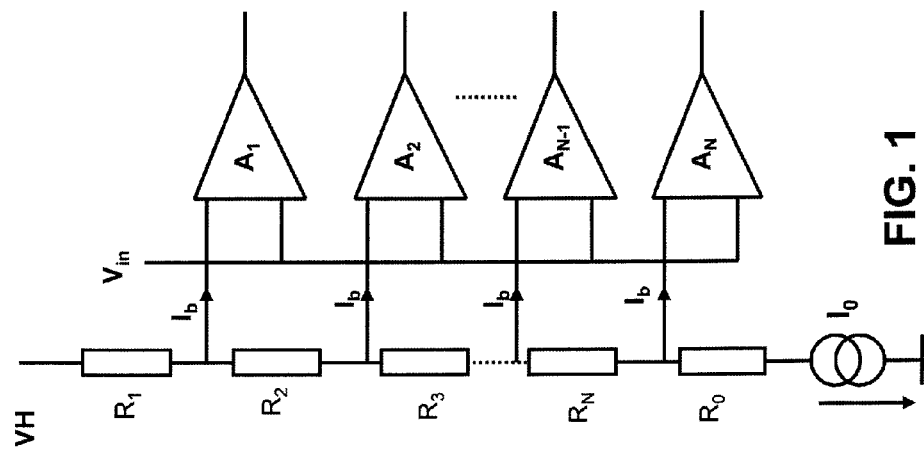
FIG. 1 represents a flash analog-digital converter principle of the prior art.
Figure 3:
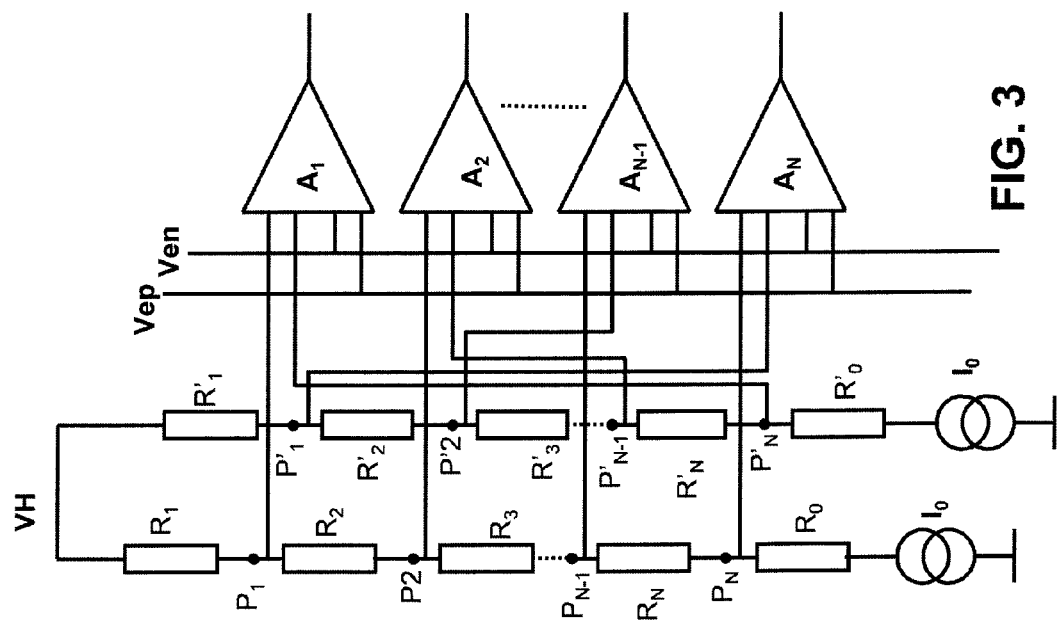
FIG. 3 represents a flash conversion structure according to the invention.

The structure of the converter of FIG. 3 uses N differential amplifiers with four inputs similar to those which are used in FIG. 2. Each differential amplifier $A_j$ of rank j, where j varies from 1 to N, possesses two first inputs receiving the differential voltage to be converted $V_{ep}-V_{en}$. A voltage $V_{ep}$ is therefore applied to a first input of all the differential amplifiers, and a voltage $V_{en}$ is applied to a second input of all the differential amplifiers.

A reference potential difference, different for each amplifier, is applied between the third and the fourth input. This potential difference is established on the basis of taps of two distinct networks of resistors, one network dedicated to the application of a reference potential to the third input, the other dedicated to the application of another reference potential to the fourth input. In FIG. 2, a single reference network was used.

The two networks of resistors are identical and traversed by identical currents $I_0$ defined by current sources. They each comprise at least N−1 identical resistors, of value R, in series, and the ends of these N−1 resistors define N taps intended to be linked to the inputs of the amplifiers. Thus, the tap $P_j$ of rank j is the junction point of the resistor $R_j$ and of the resistor $R_{j+1}$.

For the first network, the taps are denoted $P_1$ to $P_N$ and the resistors $R_1$ to $R_N$. For the second network, "prime" indices are used: taps $P'_1, P'_2, \ldots, P'_N$.

The increasing direction of the indices j from 1 to N is taken by convention in the direction of flow of the current in the networks, that is to say, when referring to the figure, the indices increase from top to bottom for the two networks which are both traversed by a current flowing from top to bottom (supply potential VH more positive at the top than at the bottom). The two networks are connected on one side to a voltage source which defines the supply potential VH. On the other side, the networks are connected to a current source in a manner such that they are traversed by identical currents.

According to the invention, the tap $P_j$ of rank j of the first network is linked to the third input of the amplifier $A_j$, and the tap $P'_{N-j+1}$ of rank N−j+1 of the second network is linked to the fourth input of the amplifier $A_j$. This is so for all ranks j. The potential difference between these two taps constitutes a reference voltage $K \cdot I_0$, K integer, for the differential amplifier $A_j$ which provides at its output a voltage proportional to the disparity between the input voltage to be converted and this reference voltage when the input voltage is close to this reference voltage. The reference potential differences $K \cdot I_0$ are regularly strung out between $-(N-1)R \cdot I_0$ and $+(N-1)R \cdot I_0$, at intervals $2R \cdot I_0$.

The integer K is in practice equal to N−2j+1 for amplifier $A_j$.

It will be noted that, by comparison with FIG. 2 and to have the same resolutions and ranges of reference voltage as in FIG. 2, the value of the resistance R used in the networks of FIG. 3 will be double that of FIG. 2, and the value of the current $I_0$ will be half that of FIG. 2.

It has been observed according to the invention not only that the first-order non-linearity error, due to the existence of the currents $I_b$ drawn off by each amplifier input, is corrected in the same manner as in the case of FIG. 2, but also that the second-order non-linearity errors, due to the fact that the current $I_b$ varies according to the level of the input voltage $V_{ep}-V_{en}$, tend to compensate one another. It will be noted that the input currents $I_b$ of all the third inputs of the amplifiers are drawn off from one of the networks while the currents $I_b$ of all the fourth inputs are drawn off from the other network.

A simulation analogous to that which was indicated above for the case of FIG. 2 has made it possible to observe an integral non-linearity error as low as 0.1 LSB, i.e. much less than previously, under the same conditions.

In the layout of FIG. 2, it has been considered that the two networks of resistors are supplied independently by two different current sources of the same value $I_0$ disposed at the foot of the networks, through foot resistors $R_0$ and $R'_0$, the head of the networks being supplied by the same supply voltage source VH. However, provision may advantageously be made for a single current source of double value $2 \times I_0$ to supply both the two networks in parallel. The head is still supplied by a voltage source VH common to the two networks. The current is divided into two equal parts of value $I_0$ since the networks are identical, but a further improvement in the second-order non-linearity error is observed.

In the foregoing it has been considered that there was a network of N amplifiers with N voltage taps of a network of N−1 resistors. The number N represents the number of conversion spans produced by the stage. For example, if the stage has to establish the 6 high-order bits of a conversion, there will be N=64 amplifiers which will deliver voltages that vary as a function of the input voltage, this voltage being used in following conversion stages to establish the low-order bits of the conversion. These following stages can be structures with folding amplifiers or other types of structures.

Figure 4:
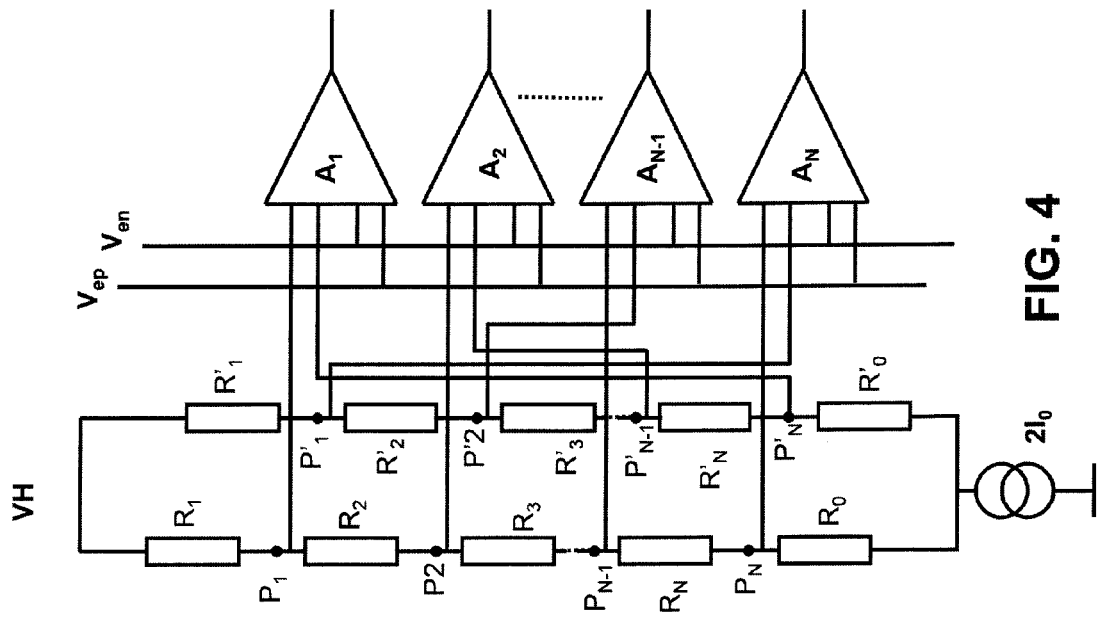
FIG. 4 represents an alternative structure according to the invention.

But even if the first stage has to establish only N conversion spans, it may be useful to make provision for there to be a larger number of amplifiers and a larger number of resistors extending the networks of FIG. 3 or 4 upwards and downwards. These additional resistors and amplifiers serve to avoid edge effects which would tend to impair the linearity towards the ends of the conversion span. It is thus possible to add several tens of amplifiers and resistors on each side of the network of N useful resistors and amplifiers.

Figure 5:
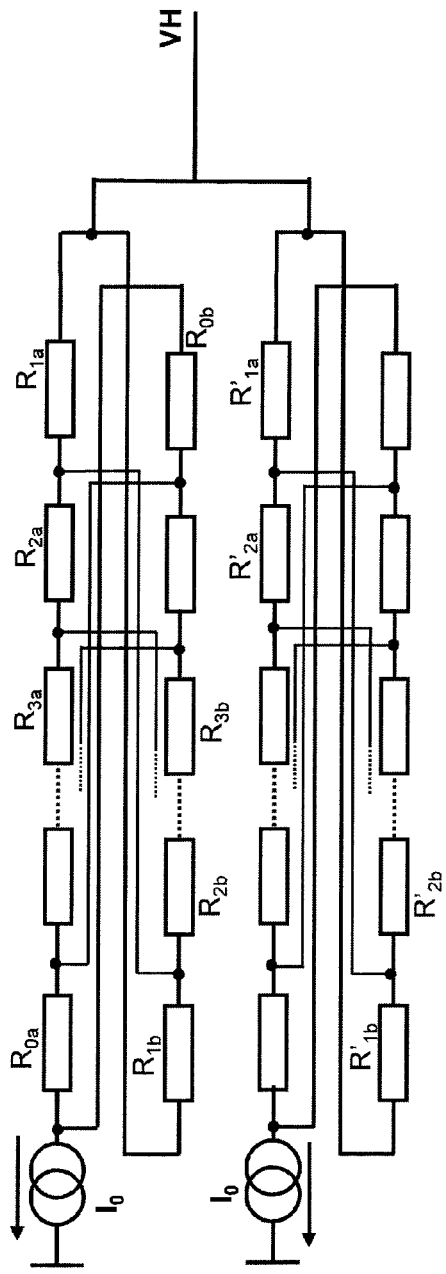
FIG. 5 represents a folded construction of the networks of resistors.

Finally, the networks of resistors stretch over a fairly large length on an integrated circuit microchip, for example 1 millimeter; now, over such a distance, the effects of thermal gradients or of technological dispersion may make themselves felt. It is advantageous under these conditions to decompose each resistor into two resistors in parallel but these two resistors being placed symmetrically with respect to the middle of the network in such a way that the temperature gradients compensate one another. FIG. 5 represents such a configuration of the networks of resistors. The resistors $R_1$, $R_2$, $R_3$ of the previous figures are each made up here of resistors in parallel; $R_{1a}$ and $R_{1b}$ make up the resistor $R_1$. $R_{2a}$ and $R_{2b}$ make up the resistor $R_2$, etc.

Given that the structure of the invention comprises networks of resistors supplied by a continuous voltage and continuous current and not by the input voltage to be converted (so-called static network or ladder of resistors, unlike other dynamic-ladder structures where it is the input voltage which is applied to the network), it is advantageous to decouple this network by capacitors each connected between a tap of the network and ground (or a terminal at fixed potential). This decoupling avoids disturbances to the reference voltages by dynamic signals such as the clock signals of sample and hold modules, or even the input signals to be converted which could be coupled by stray capacitances to the network of resistors. The added capacitances short-circuit these stray signals. It will be noted that this decoupling also reduces the thermal noise engendered by the resistors.

Figure 6:
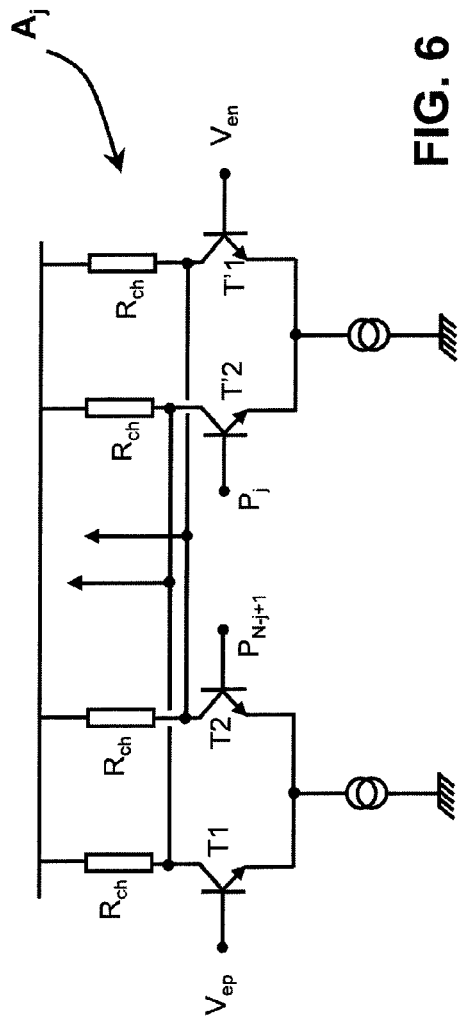
FIG. 6 represents an exemplary differential amplifier embodiment with four inputs.

FIG. 6 represents an exemplary detailed make-up of a differential amplifier $A_j$ usable in the structure of the invention. The amplifier has four inputs receiving the input signals to be converted and the voltages present on the taps $P_j$ and $P_{N-j+1}$. It is made in the form of a double amplifier composed of two simple differential transconductance amplifiers whose outputs are crossed to produce a voltage proportional to the difference between the input voltage of the first and the input voltage of the second. The assembly then produces a voltage proportional to $V_{ep}-V_{en}-K \cdot R \cdot I_0$ when the voltage $V_{ep}-V_{en}$ is close to $K \cdot R \cdot I_0$. The term $K \cdot R \cdot I_0$ represents the potential difference between the taps $P_j$ and $P_{N-j+1}$.

The first amplifier (on the left) receives the voltage $V_{ep}$ on one input (which is the first input of the amplifier $A_j$) and the voltage present on the tap $P_{N-j+1}$ on another input (which is the fourth input of $A_j$). The second amplifier (on the right) receives the voltage $V_{en}$ on one input (which is the second input of the amplifier $A_j$) and the voltage present on the tap $P_j$ on another input (which is the third input of $A_j$).

The current outputs of the amplifiers are joined so as to act as a summator; by crossing the outputs a difference is effected, so that the outputs provide a differential voltage representing, with a coefficient corresponding to the gain of the amplifier, the difference of the voltage differences applied to the inputs taken pairwise. This difference represents the quantity:

$$V_{ep} - V_{en} - K \cdot R \cdot I_0$$

More precisely, each simple differential amplifier comprises two symmetric branches supplied by the current of a single constant current source, each branch comprising a transistor in series with a load resistor $R_{ch}$. The bases of the transistors are the inputs of the amplifiers. The first amplifier receives $V_{ep}$ on the base of the first transistor T1 and receives the tap $P_{N-j+1}$ on the base of the second transistor T2. The second amplifier receives $V_{en}$ on the base of the first transistor T'1 and receives the tap $P_j$ on the base of the second transistor T'2. The outputs are arranged summator fashion but crossed: the output constituted by the collector of T1 is linked to the output constituted by the collector of T'2 so as to constitute a first output of the double differential amplifier, and vice versa the collectors of T'1 and T2 are linked to constitute a second output of the double differential amplifier; the output of the differential amplifier is constituted by one of these outputs, for example the collector of T1 if the output of the amplifier is a simple output, or by the two outputs (collectors of T1 and T2) if the output of the amplifier must be differential. The currents of the current sources are identical and the transistors and resistors of the layout are all identical.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. An analog-digital converter comprising a network of N differential amplifiers of rank j=1 to N, each having four inputs, two inputs receiving a differential input voltage to be converted $V_{ep}-V_{en}$, the third and the fourth inputs receiving reference voltages arising from a set of resistors of identical nominal values R traversed by a current of nominal value $I_0$, the amplifier of rank j providing a voltage proportional to $V_{ep}-V_{en}-K \cdot R \cdot I_0$ when the differential input voltage $V_{ep}-V_{en}$ is close to a voltage value $K \cdot R \cdot I_0$,
    wherein
    the set of resistors comprises
        a first network of N resistors of value R in series connected on one side to a constant voltage source and on the other to a constant reference current source, the ends of the resistors defining N first taps of rank j=1 to N, and
        a second network of N resistors of value R in series connected on one side to the said constant voltage source and on the other to another constant reference current source or the constant reference current source such that the two networks are supplied by identical currents, the resistors of the second network defining N second taps of rank j=1 to N, and
        the amplifier of rank j having its third input linked to a tap of rank j of the first network and its fourth input linked to a tap of rank N−j+1 of the second network, and
    each of the networks of resistors has a configuration in which each resistor is formed of two resistors in parallel, placed symmetrically with respect to the middle of the network.

2. The converter as claimed in claim 1, wherein a respective current source of value $I_0$ is provided in series with each network to impose the current which will traverse them.

3. The converter as claimed in claim 1, wherein a current source of value $2I_0$ is designed to supply the set of the two networks, each of them then being essentially traversed by half the current, namely a current $I_0$.

4. The converter as claimed in claim 1, producing N useful output voltages on conversion, comprising a number of amplifiers and resistors greater than N, the additional amplifiers and resistors being present solely to avoid edge effects.

5. The converter as claimed in claim 1, wherein a decoupling capacitor is connected between each tap of the network and a terminal at fixed potential.

6. The converter as claimed in claim 2, wherein a current source of value $2I_0$ is designed to supply the set of the two networks, each of them then being essentially traversed by half the current, namely a current $I_0$.

7. The converter as claimed in claim 2, producing N useful output voltages on conversion, comprising a number of amplifiers and resistors greater than N, the additional amplifiers and resistors being present solely to avoid edge effects.

8. The converter as claimed in claim 3, producing N useful output voltages on conversion, comprising a number of amplifiers and resistors greater than N, the additional amplifiers and resistors being present solely to avoid edge effects.

9. The converter as claimed in claim 2, wherein each of the networks of resistors has a configuration in which each resistor is formed of two resistors in parallel, placed symmetrically with respect to the middle of the network.

10. The converter as claimed in claim 3, wherein each of the networks of resistors has a configuration in which each resistor is formed of two resistors in parallel, placed symmetrically with respect to the middle of the network.

11. The converter as claimed in claim 2, wherein a decoupling capacitor is connected between each tap of the network and a terminal at fixed potential.

12. The converter as claimed in claim 3, wherein a decoupling capacitor is connected between each tap of the network and a terminal at fixed potential.

13. An analog-digital converter comprising:
    a first network of resistors having N resistors in series coupled on one side to a voltage source and on the other to a first reference current source, the resistors of the first network of resistors defining N first taps of rank j=1 to N, and each resistor having resistance of a predetermined value R and being supplied with current of a predetermined value $I_0$;
    a second network of resistors having N resistors in series coupled on one side to the voltage source and on the other to a second reference current source, the resistors of the second network of resistors defining N second taps of rank j=1 to N, and each resistor having resistance of the predetermined value R and being supplied with current of the predetermined value $I_0$, the first and second reference current sources being arranged for supplying the first and second networks of resistors with identical amount of current; and a network of amplifiers having N differential amplifiers of rank j=1 to N, each amplifier being configured to receive a pair of input signals $V_{ep}$ and $V_{en}$ and to provide an output signal responsive to $V_{ep}-V_{en}-K \cdot R \cdot I_0$, K being N−2j+1, and having four inputs:
- a first and second inputs of the four inputs being arranged for receiving the pair of input signals $V_{ep}$ and $V_{en}$,
- a third input of the amplifier of rank j being connected to a tap of rank j of the first network of resistors, and
- a fourth input of the amplifier of rank j being connected to a tap of rank N−j+1 of the second network of resistors, wherein each of the networks of resistors has a configuration in which each resistor is formed of two resistors in parallel, placed symmetrically with respect to the middle of the network.

14. An analog-digital converter comprising:
a first network of resistors having N resistors in series coupled on one side to a voltage source and on the other to a reference current source, the resistors of the first network of resistors defining N first taps of rank j=1 to N, and each resistor having resistance of a predetermined value R and being supplied with current of a predetermined value $I_0$;
a second network of resistors having N resistors in series coupled on one side to the voltage source and on the other to the reference current source, the resistors of the second network of resistors defining N second taps of rank j=1 to N, and each resistor having resistance of the predetermined value R and being supplied with current of the predetermined value $I_0$, the reference current source being arranged for supplying the first and second networks of resistors with identical amount of current; and
a network of amplifiers having N differential amplifiers of rank j=1 to N, each amplifier being configured to receive a pair of input signals $V_{ep}$ and $V_{en}$ and to provide an output signal responsive to $V_{ep}-V_{en}-K \cdot R \cdot I_0$, K being N−2j+1, and having four inputs:
- a first and second inputs of the four inputs being arranged for receiving the pair of input signals $V_{ep}$ and $V_{en}$,
- a third input of the amplifier of rank j being connected to a tap of rank j of the first network of resistors, and
- a fourth input of the amplifier of rank j being connected to a tap of rank N−j+1 of the second network of resistors, wherein each of the networks of resistors has a configuration in which each resistor is formed of two resistors in parallel, placed symmetrically with respect to the middle of the network.

* * * * *